US008547764B2

United States Patent
Yun et al.

(10) Patent No.: US 8,547,764 B2
(45) Date of Patent: Oct. 1, 2013

(54) SEMICONDUCTOR MEMORY DEVICE AND METHOD FOR PERFORMING DATA COMPRESSION TEST OF THE SAME

(75) Inventors: Jae-Woong Yun, Gyeonggi-do (KR); Jong-Chern Lee, Gyeonggi-do (KR); Hee-Jin Byun, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 308 days.

(21) Appl. No.: 12/647,196

(22) Filed: Dec. 24, 2009

(65) Prior Publication Data

US 2011/0103164 A1 May 5, 2011

(30) Foreign Application Priority Data

Oct. 30, 2009 (KR) .......................... 10-2009-0104687

(51) Int. Cl.
*G11C 7/00* (2006.01)
(52) U.S. Cl.
USPC .......................................................... 365/201
(58) Field of Classification Search
USPC .......................................................... 365/201
See application file for complete search history.

(56) References Cited

U.S. PATENT DOCUMENTS 7,084,664 B1 * 8/2006 Lee et al. ........................ 326/38

FOREIGN PATENT DOCUMENTS

| JP | 2008-299993 | 12/2008 |
| KR | 1020010090702 | 10/2001 |
| KR | 1020030008702 | 1/2003 |
| KR | 1020090094605 | 9/2009 |

OTHER PUBLICATIONS

Notice of Allowance issued from Korean Intellectual Property Office on May 3, 2011.
Notice of Preliminary Rejection issued from Korean Intellectual Property Office on Mar. 3, 2011.

* cited by examiner

*Primary Examiner* — Anthan Tran
(74) *Attorney, Agent, or Firm* — IP & T Group LLP

(57) ABSTRACT

A semiconductor memory device includes a plurality of data transmission lines, a plurality of parallel-to-serial conversion sections configured to receive, serially align, and output data from at least two of the plurality of data transmission lines, a plurality of data compression circuits configured to receive, compress, and output outputs of at least two of the plurality of parallel-to-serial conversion sections, and a plurality of data output circuits configured to output respective compression results of the plurality of data compression circuits to an outside of a chip.

7 Claims, 4 Drawing Sheets

SEMICONDUCTOR MEMORY DEVICE AND METHOD FOR PERFORMING DATA COMPRESSION TEST OF THE SAME

CROSS-REFERENCE TO RELATED APPLICATIONS

The present application claims priority of Korean Patent Application No. 10-2009-0104687, filed on Oct. 30, 2009, which is incorporated herein by reference in its entirety.

BACKGROUND OF THE INVENTION

Exemplary embodiments of the present invention relate to a semiconductor memory device, and more particularly, to technology for improving a data compression test of a semiconductor memory device.

As a semiconductor memory device is highly integrated with the development of processing technologies, in order to guarantee the reliability of a chip, a test is performed after fabrication for a lengthy time using costly testing equipment.

In semiconductor memory device testing technology, while it is important to reliably perform a test, several tens of millions of cells should be tested at a high speed. In particular, the shortening of a development period of a semiconductor memory device and of a testing time of the semiconductor memory device till placement of an end product on the market directly influences the manufacturing cost of the semiconductor memory device. Therefore, the shortening of the testing time is regarded as critical in terms of productivity and competition among manufacturers.

In general, in the field of a semiconductor memory device, after a memory chip is fabricated, it is necessary to judge a cell as pass or fail. If cells are tested one by one, it takes a long time to test a highly integrated memory device, and costs incurred increase.

Therefore, in an effort to shorten a testing time, a data compression test (also called a parallel test) is performed.

In the data compression test, after the same data are written in a plurality of cells, an exclusive OR gate or the like is used upon read. Therefore, if the same data are read out from the plurality of cells, judgment is made as pass by outputting '1', and, if even one of the data is different from the other data, judgment is made as fail by outputting '0'.

FIG. 1 is a view illustrating parts associated with a data compression test of a conventional semiconductor memory device.

A plurality of data transmission lines GIO represent lines which transmit the data read out from a cell array, to the vicinity of output pads. Usually, these lines are called global input/output lines (GIO).

Each of a plurality of data compression circuits COMP receives data from at least two data transmission lines GIO, compresses received data, and outputs compressed data. Data are compressed at a data compression rate, such as of 2:1, 4:1, and so on, depending upon the number of data transmission lines GIO each data compression circuit COMP receives data through. Here, the data compression generates a result, representing whether all the data received by the data compression circuit COMP are the same or even one of the data is different from the other data. For example, if all the data received by the data compression circuit COMP have the same value, an output COMP_OUT of the data compression circuit COMP becomes '1', and, if even one of the data received by the data compression circuit COMP has a different value, the output COMP_OUT of the data compression circuit COMP becomes '0'.

A plurality of parallel-to-serial conversion sections P2S receive the compression results COMP_OUT outputted from data compression circuits COMP, parallel-to-serial convert the compression results COMP_OUT at a rate of N:1, and output converted results. The value of N changes depending upon the number of compression results COMP_OUT that each of the parallel-to-serial conversion sections P2S receives. For example, if the parallel-to-serial conversion section P2S receives eight compression results COMP_OUT, as shown in FIG. 1, the parallel-to-serial conversion section P2S aligns in series the compression results COMP_OUT outputted from eight data compression circuits COMP on one line and outputs the serially aligned compression results. Examples of the parallel-to-serial conversion sections P2S include pipe latches.

A plurality of output circuits DQ UNIT output the serially aligned compression results COMP_OUT_S outputted from the parallel-to-serial conversion sections P2S, to an outside of a chip. As illustrated in FIG. 1, the compressed data are outputted to four data pads DQ<0> to DQ<3>. The number of data pads DQ to be used in a data compression test can be changed as desired, depending upon a data compression rate.

While the data compression test is necessary for improving the test efficiency of a semiconductor memory device, in order to perform the data compression test, additional circuits are needed in the semiconductor memory device.

If the area occupied by the additional circuits can be reduced, the productivity of the semiconductor memory device will of course be significantly improved.

SUMMARY OF THE INVENTION

An embodiment of the present invention is directed to reducing the area of entire circuits provided for a data compression test of a semiconductor memory device, thereby decreasing the manufacturing cost of the semiconductor memory device.

In accordance with an embodiment of the present invention, a semiconductor memory device includes a plurality of data transmission lines, a plurality of parallel-to-serial conversion sections configured to receive, serially align, and output data from at least two of the plurality of data transmission lines, a plurality of data compression circuits configured to receive, compress, and output outputs of at least two of the plurality of parallel-to-serial conversion sections, and a plurality of data output circuits configured to output respective compression results of the plurality of data compression circuits to an outside of a chip.

In accordance with another embodiment of the present invention, a semiconductor memory device includes a plurality of data transmission lines, a plurality of parallel-to-serial conversion sections configured to receive data from at least four of the plurality of data transmission lines and output rising serial data and falling serial data, a plurality of rising data compression circuits configured to receive and compress at least two of the rising serial data, a plurality of falling data compression circuits configured to receive and compress at least two of the falling serial data, and a plurality of data output circuits configured to output compression results of the plurality of rising data compression circuits and the plurality of falling data compression circuits to an outside of a chip.

In accordance with another embodiment of the present invention, a method for performing a data compression test of a semiconductor memory device includes reading out a plurality of data from a cell array region, transmitting the plurality of data to a vicinity of data pads, parallel-to-serial converting the plurality of data at a rate of N:1, where N is a positive integer, to obtain parallel-to-serial converted data, compressing the parallel-to-serial converted data to obtain compressed data, and outputting the compressed data to an outside of a chip.

In accordance with another embodiment of the present invention, a method for performing a data compression test of a semiconductor memory device includes reading out a plurality of data from a cell array region, transmitting the plurality of data to a vicinity of data pads via an A number of first data transmission lines, where A is a positive integer, parallel-to-serial converting the plurality of data on the A number of first data transmission lines to obtain converted data and transmitting the converted data to a B number of second data transmission lines, where B is a positive integer no greater than A/2, compressing the converted data transmitted on the B number of second data transmission lines to obtain compressed data and transmitting the compressed data to a C number of third data transmission lines, where C is a positive integer no greater than B/2, and outputting the compressed data transmitted on the C number of third data transmission lines to an outside of a chip.

DESCRIPTION OF SPECIFIC EMBODIMENTS

Figure 1:
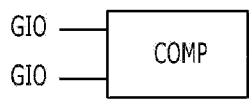
FIG. 1 is a view illustrating parts associated with a data compression test of a conventional semiconductor memory device.
Figure 1:
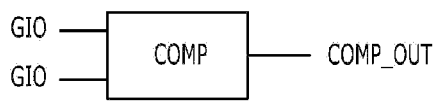
Figure 1:
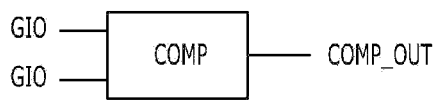
Figure 1:
Figure 1:
Figure 1:
Figure 1:
Figure 1:
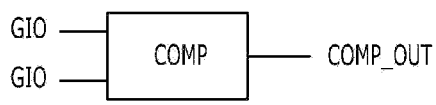
Figure 1:
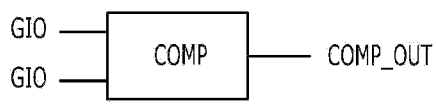

Exemplary embodiments of the present invention will be described below in more detail with reference to the accompanying drawings. The present invention may, however, be embodied in different forms and should not be construed as limited to the embodiments set forth herein. Rather, these embodiments are provided so that this application will be thorough and complete, and will fully convey the scope of the present invention to those skilled in the art. Throughout the application, like reference numerals refer to like parts throughout the various figures and embodiments of the present invention.

Figure 2:
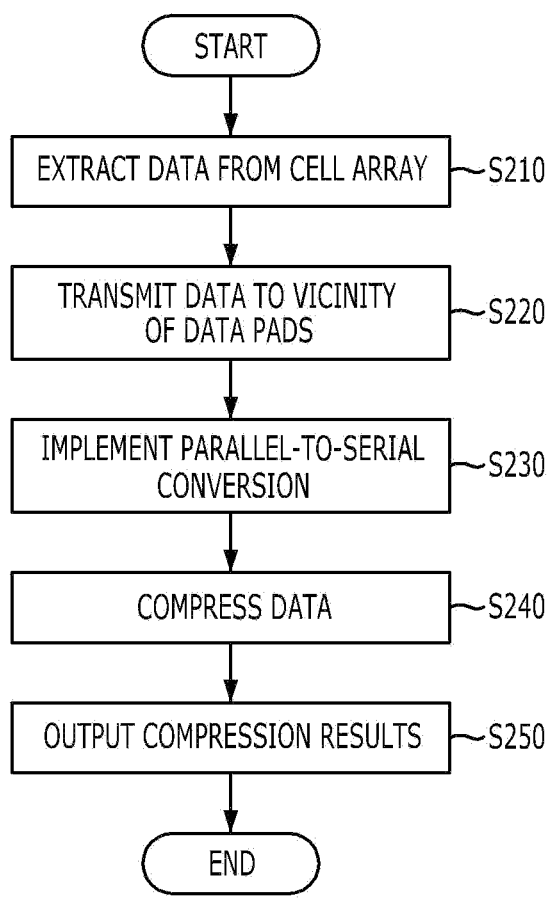
FIG. 2 is a block diagram illustrating a method for performing a data compression test of a semiconductor memory device in accordance with an embodiment of the present invention.

FIG. 2 is a block diagram illustrating a method for performing a data compression test of a semiconductor memory device in accordance with an embodiment of the present invention.

Referring to FIG. 2, at a step S210, a plurality of data are first read out from a cell array. At a step S220, the read-out data are transmitted to the vicinity of data pads through data transmission lines. At a step S230, parallel-to-serial conversion is implemented in the vicinity of the data pads.

If sixty four data are simultaneously read out from a cell array region, the data are transmitted to the vicinity of data pads DQ by being loaded on sixty four data transmission lines GIO. After parallel-to-serial conversion is implemented, the number of lines for transmitting the data is decreased to at least one half. This is because the number of data transmission lines is decreased to one half when the parallel-to-serial conversion is implemented even at the rate of 2:1. If the parallel-to-serial conversion is implemented at the rate of 8:1, the data loaded received on the sixty four data transmission lines GIO are loaded onto just eight lines.

After the step of S230 in which the parallel-to-serial conversion is implemented, at a step of S240, data compression is implemented. Since the data are compressed after the parallel-to-serial conversion is already implemented, the data compression at step S240 can be simplified in comparison with a configuration in which data compression is implemented before the parallel-to-serial conversion. For example, if the data compression is implemented before the parallel-to-serial conversion, the data loaded on the sixty four lines should be compressed. However, if the data compression is implemented after the parallel-to-serial conversion, it is sufficient to compress the data loaded only on the eight lines. Since the data compression is implemented at a rate of at least 2:1, the number of lines, on which compressed data are loaded after the data compression, is further decreased to at least one half in comparison with before the data compression.

After the step of S240 in which the data compression is implemented, at a step of S250, the compressed data are outputted to an outside of a chip through data pads. Then, by analyzing the outputted compressed data, it is possible to judge the data as pass or fail.

In the embodiment described above, the data read out from the cell array are compressed after having undergone a parallel-to-serial conversion procedure. Therefore, the number of lines on which data to be compressed are loaded can be decreased to one half, one eighths, and so on, and accordingly, the area of the entire data compression circuits can also be reduced to one half, one eighths, and so on.

Figure 3:
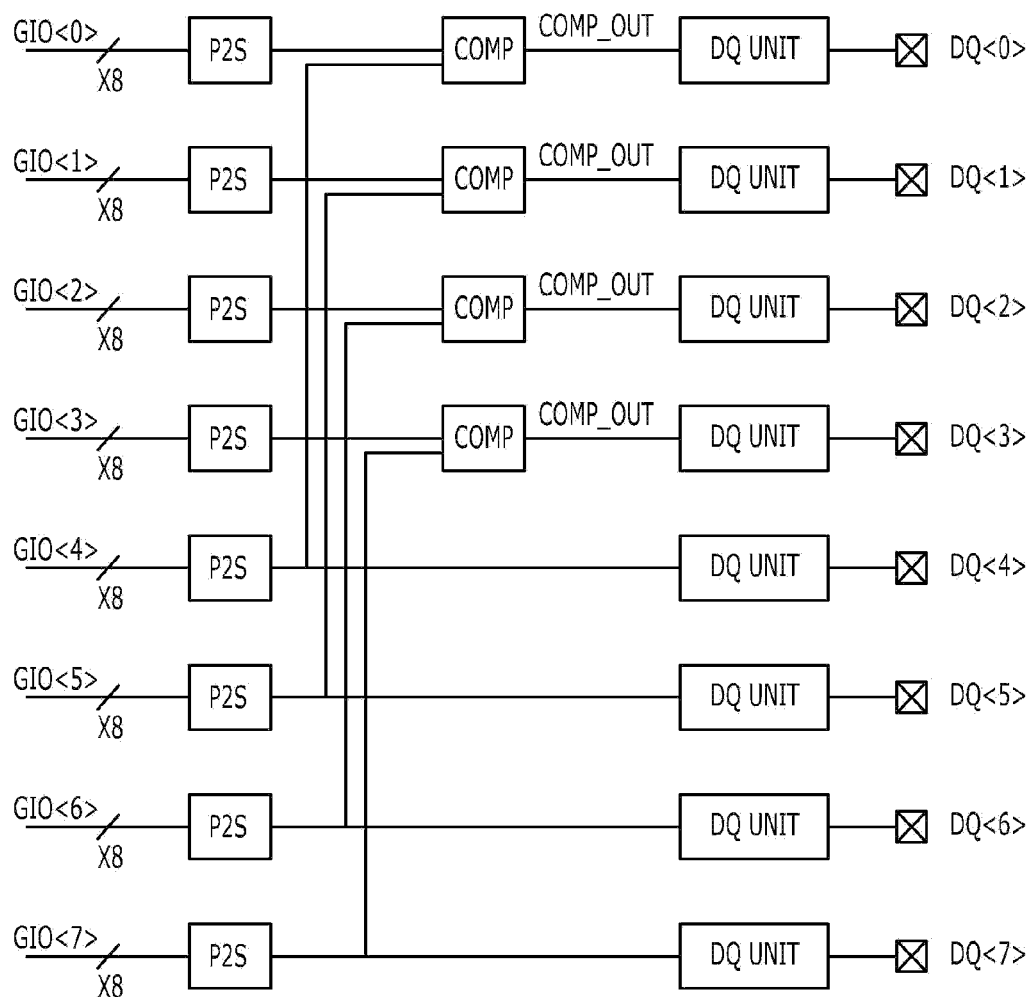
FIG. 3 is a view illustrating the configuration of a semiconductor memory device in accordance with another embodiment of the present invention.

FIG. 3 is a view illustrating the configuration of a semiconductor memory device in accordance with another embodiment of the present invention.

Referring to FIG. 3, a semiconductor memory device in accordance with another embodiment of the present invention includes a plurality of data transmission lines GIO, a plurality of parallel-to-serial conversion sections P2S, a plurality of data compression circuits COMP, and a plurality of data output circuits DQ UNIT.

The plurality of data transmission lines GIO transmit the data read out from a cell array region to the vicinity of data pads DQ<0> to DQ<7>.

The plurality of parallel-to-serial conversion sections P2S align in series and then output the data received from the data transmission lines GIO. In the parallel-to-serial conversion sections P2S, a parallel-to-serial conversion rate changes depending upon the number of data transmission lines GIO from which each parallel-to-serial conversion section P2S receives data. In the case of implementing parallel-to-serial conversion at the rate of 2:1, each parallel-to-serial conversion section P2S receives data from two data transmission lines GIO, and in the case of implementing parallel-to-serial conversion at the rate of 8:1, as shown in the FIG. 3, each parallel-to-serial conversion section P2S receives data from eight data transmission lines GIO. In such a memory device, pipe latches are usually used as the parallel-to-serial conversion sections P2S.

The plurality of data compression circuits COMP compress the data that are serially converted through the parallel-to-serial conversion sections P2S, and output corresponding compression results COMP_OUT. The data compression generates a result indicating whether all the data received by the data compression circuit COMP are the same or even one of the data is different from the other data. Since the data compression circuit COMP implements a data compression operation at a rate of at least 2:1, the data compression circuit COMP receives at least two line inputs. The data compression circuits COMP are provided for a data compression test. In normal operation, each data compression circuit COMP bypasses the data of one line among the number of lines through which it receives data.

The plurality of data output circuits DQ UNIT output compression results COMP_OUT, outputted from the data compression circuits COMP, to an outside of a chip. Since the data are compressed at the rate of 2:1 through the data compression circuits COMP, only one half of the data output circuits DQ UNIT are used. For example, as shown in FIG. 3, compression results are outputted to data pads DQ<0> to DQ<3>, whereas data pads DQ<4> to DQ<7> are not used in the data compression test (i.e., test equipment is not connected to the data pads DQ<4> to DQ<7>). Of course, in the case where the data compression circuits COMP compress the data at the rate of 4:1 or 8:1, compression results will be outputted to an even further reduced number of data pads DQ.

In the embodiment of FIG. 3, the data compression circuits COMP are disposed at the back ends of the parallel-to-serial conversion sections P2S. The number of the data compression circuits COMP is decreased in proportion to the parallel-to-serial conversion rate of the parallel-to-serial conversion sections P2S. In FIG. 3, since the parallel-to-serial conversion sections P2S implement parallel-to-serial conversion at the rate of 8:1, it can be observed that the number of data compression circuits COMP is decreased to one eighth of the number of data compression circuits COMP of the conventional art (see FIG. 1).

Figure 4:
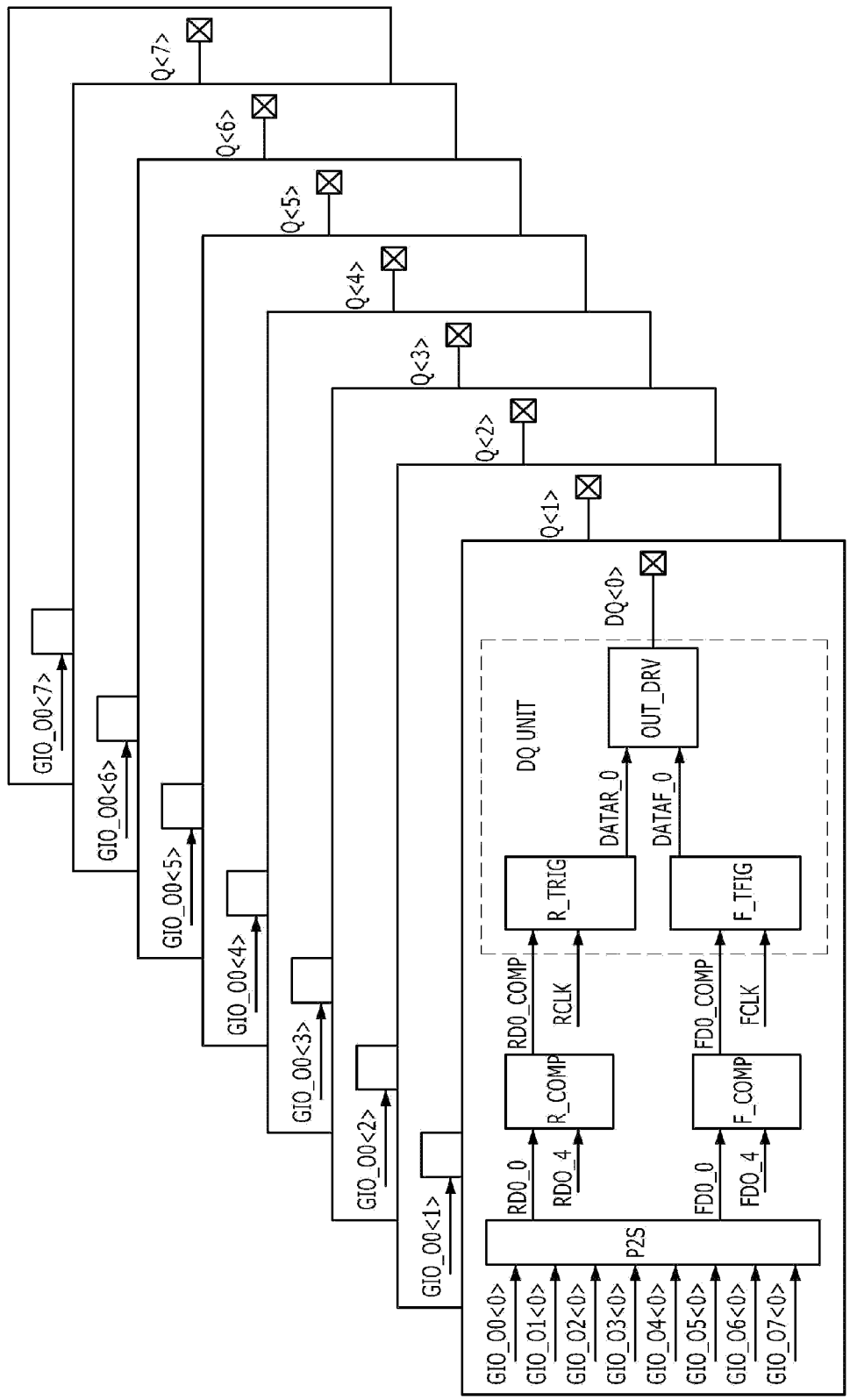
FIG. 4 is a view illustrating in detail the semiconductor memory device according to an embodiment of the present invention.

FIG. 4 is a view illustrating in detail the semiconductor memory device according to an embodiment of the present invention.

In FIG. 4, a portion associated with one data pad DQ is shown at one page. The front four pages represent portions which are respectively associated with the data pads DQ<0> to DQ<3>, and the rear four pages represent portions which are respectively associated with the data pads DQ<4> to DQ<7>. The compression results obtained by the data compression test are outputted to the data pads DQ<0> to DQ<3> and are not outputted to the data pads DQ<4> to DQ<7>.

The frontmost page, that is, a portion associated with the data pad DQ<0> will be described below in more detail. The data read out from the cell array region are transmitted to the parallel-to-serial conversion section P2S through the data transmission lines GIO_00<0> to GIO_07<0>.

The parallel-to-serial conversion section P2S divides the data transmitted through the data transmission lines GIO_00<0> to GIO_07<0> into rising data and falling data, serially converts the rising data and the falling data, and outputs rising serial data RDO_0 and falling serial data FDO_0. The rising data represent data that are aligned with the rising edges of a clock signal, and the falling data represent data that are aligned with the falling edges of the clock signal. Accordingly, the data of four lines (for example, GIO_00,02,04,06<0>) among the data transmission lines GIO are serially aligned as the rising serial data RDO_0, and the data of the remaining four lines (for example, GIO_01, 03,05,07) among the data transmission lines GIO are serially aligned as the falling serial data FDO_0. In the embodiment shown in FIG. 4, while it was illustrated that the parallel-to-serial conversion section P2S divides the data into the rising data and the falling data and serially aligns these respective data, it is conceivable that the parallel-to-serial conversion section P2S does not divide data into rising data and falling data and the entire data are serially converted onto one line, as shown in FIG. 3.

Referring to FIG. 4, however, a rising data compression circuit R_COMP receives, compresses, and outputs rising serial data RDO_O and rising serial data RDO_4. The rising serial data RDO_4 represent data that are obtained by serially converting rising data on lines GIO_00<4> to GIO_07<4> of a fifth page.

A falling data compression circuit F_COMP receives, compresses, and outputs falling serial data FDO_0 and falling serial data FDO_4. The falling serial data FDO_4 represent data that are obtained by serially converting falling data on lines GIO_00<4> to GIO_07<4> of the fifth page.

A data output circuit DQ UNIT outputs the compression results of the rising data compression circuit R_COMP and the falling data compression circuit F_COMP to the data pad DQ<0>. The data output circuit DQ_UNIT includes a rising trigger R_TRIG, a falling trigger F_TRIG, and an output driver OUT_DRV. The rising trigger R_TRIG transmits a compression result RDO_COMP of the rising data compression circuit R_COMP to the output driver OUT_DRV in synchronism with a rising clock signal RCLK. The falling trigger F_TRIG transmits a compression result FDO_COMP of the falling data compression circuit F_COMP to the output driver OUT_DRV in synchronism with a falling clock signal FCLK. Also, the output driver OUT_DRV outputs the data transmitted from the rising trigger R_TRIG and the falling trigger F_TRIG to the data pad DQ<0>.

The rising data compression circuit R_COMP and the falling data compression circuit F_COMP are provided for the data compression test, and in normal operation, do not compress and bypass the rising serial data RDO_O and the falling serial data FDO_O (i.e. in normal operation RDO_0=RDO_COMP and FDO_0=FDO_COMP). However, in the embodiment shown in FIG. 4, it is assumed that the compression test is being performed, and therefore, the data compression circuits R_COMP and F_COMP compress the data at the rate of 2:1. Thus, one half of the data pads, for example, DQ<0> to DQ<3> among the data pads DQ<0> to DQ<7> are used in the data compression test. Accordingly, the data compression circuits R_COMP, F_COMP are not provided in the fourth through eighth pages. Of course, when in the normal operation, and not in the data compression test mode, corresponding data are respectively outputted to the data pads DQ<0> to DQ<7>. For example, data of lines GIO_00<3> to GIO_07<3> are outputted to the data pad DQ<3> by being serially aligned, and data of lines GIO_O0<7> to GIO_07<7> are outputted to the data pad DQ<7> by being serially aligned.

As is apparent from the above description, in a data compression test, data read out from a cell array are compressed after having undergone a parallel-to-serial conversion procedure. Therefore, the number of data compression circuits for compression can be significantly reduced when compared to the conventional art.

For example, in the case of a semiconductor memory device for parallel-to-serial converting data at a rate of 8:1, the number (and thus area) of data compression circuits can be reduced to one eighth of the number of data compression circuits of the conventional art.

While the present invention has been described with respect to the specific embodiments, it will be apparent to those skilled in the art that various changes and modifications may be made without departing from the spirit and scope of the invention as defined in the following claims.

In particular, the data compression rate of data compression circuits and the number of data pads can of course be varied depending upon a design.

What is claimed is:

1. A semiconductor memory device comprising:
a plurality of data transmission lines;
a plurality of parallel-to-serial conversion sections configured to receive, serially align, and output data from at least two of the plurality of data transmission lines;
a plurality of data compression circuits configured to receive and compress outputs of at least two of the plurality of parallel-to-serial conversion sections, and output compression results; and
a plurality of data output circuits configured to output respective compression results of the plurality of data compression circuits to an outside of a chip,
wherein the compression results include information regarding whether bits of data to be compressed are the same with each other or different,
wherein single data compression circuit among the plurality of data compression circuits receives and compresses outputs of the at least two parallel-to-serial conversion sections, and outputs the single corresponding compression result.

2. The semiconductor memory device of claim 1, wherein the parallel-to-serial conversion sections comprise pipe latches.

3. The semiconductor memory device of claim 1, wherein the plurality of parallel-to-serial conversion sections respectively receive data from different ones of the plurality of data transmission lines, and the plurality of data compression circuits respectively receive outputs of different ones of the plurality of parallel-to-serial conversion sections.

4. A semiconductor memory device comprising:
a plurality of data transmission lines;
a plurality of parallel-to-serial conversion sections configured to receive data from at least four of the plurality of data transmission lines and output rising serial data and falling serial data;
a plurality of rising data compression circuits configured to receive and compress at least two of the rising serial data;
a plurality of falling data compression circuits configured to receive and compress at least two of the falling serial data; and
a plurality of data output circuits configured to output compression results of the plurality of rising data compression circuits and the plurality of falling data compression circuits to an outside of a chip.

5. The semiconductor memory device of claim 4, wherein the parallel-to-serial conversion sections comprise pipe latches.

6. The semiconductor memory device of claim 4, wherein the plurality of parallel-to-serial conversion sections respectively receive data from different ones of the plurality of data transmission lines, the plurality of rising data compression circuits respectively receive rising serial data of different ones of the plurality of parallel-to-serial conversion sections, and the plurality of falling data compression circuits respectively receive falling serial data of different ones of the plurality of parallel-to-serial conversion sections.

7. The semiconductor memory device of claim 4, wherein the compression results include information regarding whether data to be compressed are the same or different.

* * * * *